US006771979B2

(12) United States Patent
Fukuzumi

(10) Patent No.: US 6,771,979 B2
(45) Date of Patent: Aug. 3, 2004

(54) MOBILE TELEPHONE

(75) Inventor: Tomoya Fukuzumi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 679 days.

(21) Appl. No.: 09/836,374

(22) Filed: Apr. 18, 2001

(65) Prior Publication Data
US 2002/0052217 A1 May 2, 2002

(30) Foreign Application Priority Data
Oct. 26, 2000 (JP) ........................................ 2000-326782

(51) Int. Cl.$^7$ ............................ H04M 1/00; G11C 16/04
(52) U.S. Cl. ................................. 455/550.1; 455/186.1; 365/185.04; 365/185.11
(58) Field of Search ........................... 455/550.1, 73, 455/90.3, 186.1, 575.1, 558; 365/185.01, 185.03, 185.11, 185.33, 238.5, 235, 230.1, 185.08, 185.09

(56) References Cited

U.S. PATENT DOCUMENTS

| 5,185,718 A | * | 2/1993 | Rinerson et al. ....... | 365/185.12 |
| 5,200,600 A | * | 4/1993 | Shinagawa ................ | 235/492 |
| 6,091,666 A | * | 7/2000 | Arase et al. ............. | 365/238.5 |
| 6,163,485 A | * | 12/2000 | Kawahara et al. ..... | 365/185.24 |
| 6,172,397 B1 | * | 1/2001 | Oonakado et al. ......... | 257/321 |
| 6,301,150 B1 | * | 10/2001 | Kanamitsu et al. .... | 365/185.03 |
| 6,341,085 B1 | * | 1/2002 | Yamagami et al. .... | 365/185.09 |
| 6,347,051 B2 | * | 2/2002 | Yamagami et al. .... | 365/185.09 |

FOREIGN PATENT DOCUMENTS

JP           2000-32114           1/2000

* cited by examiner

Primary Examiner—Sonny Trinh
(74) Attorney, Agent, or Firm—Oblon, Spivak, McClelland, Maier & Neustadt, P.C.

(57) ABSTRACT

A mobile telephone (52) comprises a flash memory (3) having a sector data structure. A flash memory (3) has a sector data structure and stores user data (UD) and a firmware (FW) in a sector unit. A user data buffer (4A) and a firmware buffer (4B) are random accessible memories. The buffers (4A) and (4B) store the user data (UD) and firmware (FW) transferred from the memory (3) together with recognition numbers thereof, respectively. As a result of retrieval in the buffer (4B) which is carried out by a CPU (1), when the firmware (FW) required for the execution of an operation input by a user is not present in the buffer (4B), the CPU (1) controls a sequencer (2) to transfer the necessary firmware (FW) from the memory (3) to the buffer (4B). The CPU (1) executes the operational contents by utilizing the firmware (FW) in the buffer (4B). The CPU (1) also utilizes the user data (UD) in the same manner as the firmware (FW).

6 Claims, 14 Drawing Sheets

| RECOGNITION NUMBER N | USER DATA UD (CONTENT) |
|---|---|
| 0x8EE3FE38 | MUSIC DATA II |
| 0x8EE3FD38 | MUSIC DATA I |
| ... | ... |
| 0x8EE3F138 | TELEPHONE BOOK DATA I |

2A

| bit15 | bit14 | bit13 | bit12 | bit11 | bit10 | bit9 | bit8 | bit7 | bit6 | bit5 | bit4 | bit3 | bit2 | bit1 | bit0 |
|---|---|---|---|---|---|---|---|---|---|---|---|---|---|---|---|
| PHYSICAL SECTOR ADDRESS OF FLASH MEMORY (FMPSN) | | | | | | | | | | | | | | INVALID | SeqFExe |

FIG. 5

| RECOGNITION NUMBER N | USER DATA UD OR FIRMWARE FW (CONTENT) |
|---|---|
| 0x8EE3FE38 | MUSIC DATA II |
| ... | ... |
| 0x8EE3F438 | TELEPHONE BOOK DATA I |
| 0x8EE3F338 | BASIC FIRMWARE USED IMMEDIATELY AFTER POWER IS TURNED ON |
| 0x8EE3F238 | FIRMWARE RELATED TO USER OPERATION OF "HOME PAGE RETRIEVAL" |
| 0x8EE3F138 | FIRMWARE RELATED TO USER OPERATION OF "TELEPHONE BOOK RETRIEVAL" |

2B

| bit15 | bit14 | bit13 | bit12 | bit11 | bit10 | bit9 | bit8 | bit7 | bit6 | bit5 | bit4 | bit3 | bit2 | bit1 | bit0 |
|---|---|---|---|---|---|---|---|---|---|---|---|---|---|---|---|
| PHYSICAL SECTOR ADDRESS OF FLASH MEMORY (FMPSN) ||||||||||||| | BfNum | SeqFExe |

F I G . 1 1

MOBILE TELEPHONE

BACKGROUND OF THE INVENTION

1. Field of the Invention

The present invention relates to a mobile telephone, and more particularly to a technique for applying a semiconductor memory having a sector data structure to a memory system of the mobile telephone.

2. Description of the Background Art

In recent years, capacities of user data and a firmware tend to be increased more and more with the diversification of a mobile telephone. In a conventional mobile telephone, these data and the like are stored in a random accessible flash memory, for example, a DINOR (divided bit line NOR) type flash memory.

FIG. 16 is a block diagram typically showing a general DINOR type 16 Mbit flash memory 200. As shown in FIG. 16, the flash memory 200 comprises a memory cell array 212, an X-decoder 211, a Y-decoder 207, a Y-gate/sense amplifier 208, a command user interface (command user I/F) 201, a write state machine 221, a status/ID register 222, a multiplexer 203 and an input/output buffer 220. The write state machine 221 controls internal write and the status/ID register 222 holds internal write Pass/Fail and a device ID. Furthermore, the flash memory 200 comprises address terminals A0 to A7 connected to the Y-decoder 207, address terminals A8 to A20 connected to the X-decoder 211, terminals CE#, OE#, WE#, WP and RP# connected to the command user interface 201, a terminal RY/BY# connected to the write state machine 221, and data output terminals D0 to D7 connected to the input/output buffer 220.

In the flash memory 200, contents stored in the memory cell array 212 are read out in the following manner. First of all, the terminals CE# and OE# are set to "L" and the terminal WE# is set to "H", and such values are input to the write state machine 221 through the command user interface 201. At this time, an address signal is input to the X-decoder 211 and the Y-decoder 207 through the address terminals A0 to A20. In response to these signals, the write state machine 221, the X-decoder 211, the Y-decoder 207 and the Y-gate/sense amplifier 208 are operated so that data on a desired address are read to the input/output buffer 220 through the multiplexer 203. Consequently, the stored contents are output to the data output terminals D0 to D7.

It is difficult to further increase the capacity of the random accessible flash memory. Thus, it has been hard to correspond to the user data and the firmware having capacities increased more and more.

As one means capable of solving such a problem, it can be proposed that a flash memory having a sector data structure is used in place of the random accessible flash memory. The flash memory is more excellent in an increase in a capacity than the random accessible flash memory.

A read access method of the flash memory is different from that of the random accessible flash memory. More specifically, the stored contents are read out in a sector unit in the flash memory having the sector data structure. Moreover, a read command and a sector address are sequentially input (in time series) so that the contents stored in a sector are read out serially.

For this reason, there is a problem in that the random accessible flash memory cannot be exactly replaced with the flash memory having the sector data structure due to a difference in the read access method.

Furthermore, there is a latency time (read access latency time) during reading in the flash memory having the sector data structure until a sector address is input and read (serial read) can be then carried out. In general, there is also a problem in that the latency time is longer than that in the random accessible flash memory.

These problems make it hard to mount the flash memory having the sector data structure on the conventional mobile telephone.

SUMMARY OF THE INVENTION

A first aspect of the present invention is directed to a mobile telephone comprising a controller, a first semiconductor memory which is random accessible and the controller can access, a second semiconductor memory which is connected to the first semiconductor memory and includes a flash memory, and a memory-controller provided between the second semiconductor memory and the controller to connect the second semiconductor memory and the controller and to control the first semiconductor memory and the second semiconductor memory based on a control instruction sent from the controller, wherein the second semiconductor memory has a sector data structure including a plurality of sectors and storing a content in a sector unit, and the memory-controller controls the first semiconductor memory and the second semiconductor memory based on the control instruction sent from the controller, to execute a transfer processing of transferring a predetermined content stored in a predetermined one of the sectors to the first semiconductor memory and storing the predetermined content in the first semiconductor memory.

A second aspect of the present invention is directed to the mobile telephone according to the first aspect of the present invention, wherein the predetermined content has a predetermined recognition number, and the first semiconductor memory stores the predetermined content and the predetermined recognition number.

A third aspect of the present invention is directed to the mobile telephone according to the first aspect of the present invention, wherein the controller retrieves that the predetermined content is stored in the first semiconductor memory or not before giving the control instruction to the memory-controller.

A fourth aspect of the present invention is directed to the mobile telephone according to the second aspect of the present invention, wherein the controller retrieves that the predetermined recognition number is stored in the first semiconductor memory or not before giving the control instruction to the memory-controller.

A fifth aspect of the present invention is directed to the mobile telephone according to the first to fourth aspects of the present invention, wherein the first semiconductor memory has a capacity for at least two of the sectors.

A sixth aspect of the present invention is directed to the mobile telephone according to the first to fifth aspects of the present invention, wherein the memory-controller has a register for the controller to write the control instruction and resets a value of the register after the transfer processing is ended.

According to the first aspect of the present invention, the memory-controller transfers the predetermined content in the second semiconductor memory to the first semiconductor memory and stores the same content in the first semiconductor memory in response to the control instruction of the controller. Consequently, the controller can utilize the predetermined content by accessing the first semiconductor memory in place of the second semiconductor memory. Therefore, also in the case in which different access methods are used for the second semiconductor memory and the first semiconductor memory, such a difference can be absorbed and the controller does not need to use or properly use the two kinds of access methods. In this case, it is possible to easily increase a memory capacity of the whole mobile telephone with an increase in a capacity of the second semiconductor memory.

According to the second aspect of the present invention, the content stored in the first semiconductor memory can be specified based on the recognition number. Consequently, the controller can know whether the predetermined (desired) content is stored in the first semiconductor memory or not before giving the control instruction to the memory-controller. As a result, it is possible to prevent an unnecessary or repetitive transfer processing for the stored content. Moreover, the controller does not need to finely grasp the whole first semiconductor memory through the use of the recognition number.

According to the third aspect of the present invention, in the case in which the predetermined content is stored in the first semiconductor memory, the controller can access the first semiconductor memory to utilize the predetermined content without giving an instruction for the transfer processing to the memory-controller. Accordingly, it is possible to implement a processing at a higher speed by omitting a time required for the transfer processing from the second semiconductor memory to the first semiconductor memory.

According to the fourth aspect of the present invention, the controller can confirm the content stored in the first semiconductor memory based on the recognition number. Therefore, the same effects as those in the third aspect of the present invention can be obtained. By using the recognition number, particularly, the controller does not need to finely retrieve the whole first semiconductor memory.

According to the fifth aspect of the present invention, the first semiconductor memory can store the contents for a plurality of sectors. Therefore, the controller can utilize a plurality of contents at the same time or in parallel. Consequently, the controller does not need to carry out an interruption processing for the transfer processing in the middle of the processing.

According to the sixth aspect of the present invention, the controller can know the end of the transfer processing based on the fact that the value of the register of the memory-controller is reset. Consequently, the controller can properly know that the predetermined content is set in an available state in the first semiconductor memory.

In consideration of such a respect, it is an object of the present invention to provide a mobile telephone comprising a semiconductor memory having a sector data structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a typical diagram showing an operating state register of a flash sequencer according to the first embodiment, FIG. 11 is a typical diagram showing an operating state register of a flash sequencer according to the second embodiment.

DESCRIPTION OF THE PREFERRED EMBODIMENTS

<First Embodiment>

Figure 1:
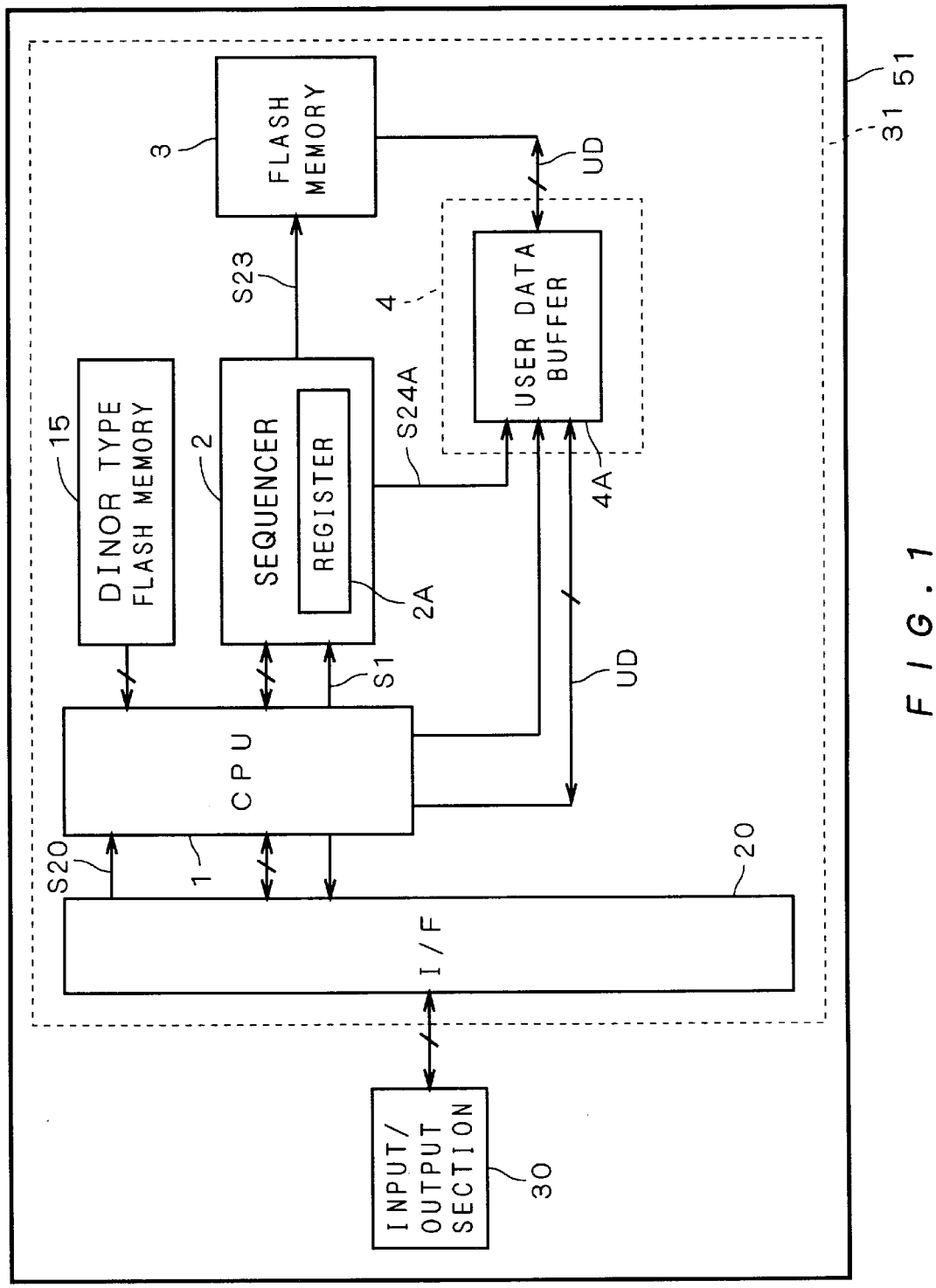
FIG. 1 is a typical block diagram showing a mobile telephone according to a first embodiment.

FIG. 1 is a typical block diagram showing a mobile telephone 51 according to a first embodiment. As shown in FIG. 1, the mobile telephone 51 comprises an input/output section 30 and a main circuit section 31 which are connected to each other.

The input/output section 30 has a structure for a user to input a voice, various data, operational information and the like, for example, a microphone, a ten key and the like. Furthermore, the input/output section 30 has a structure for outputting a talking voice and the like, for example, a speaker, an audio output terminal and the like, and has a structure for displaying various information and the like, for example, a liquid crystal display and the like. Moreover, the input/output section 30 includes an operating circuit, a signal processing circuit and the like for the microphone and the like.

As shown in FIG. 1, the main circuit section 31 includes a user interface 20, a CPU (or a controller) 1, a DINOR type flash memory 15, a flash memory (or a second semiconductor memory) 3, a flash sequencer (or a memory-controller) 2 and a buffer (or a first semiconductor memory) 4. In the following description, the user interface and the flash sequencer will be simply referred to as an "interface" and a "sequencer", respectively. Moreover, the user interface is shown as "I/F" in the drawing.

The input/output section 30 and the CPU 1 are connected to each other through the interface 20. The interface 20 controls access between the input/output section 30 and the CPU 1.

The CPU 1 executes various processings and control in the mobile telephone 51. A specific operation of the CPU 1 will be described below in detail. The CPU 1 can also control the input/output section 30 and other circuits which will be described later. In order to avoid complexity of the drawing, these control systems are not shown in FIG. 1.

The DINOR type flash memory 15 stores the procedure for various operations to be executed by the CPU 1 (which will be hereinafter referred to as a "firmware"), and is provided to cause the CPU 1 to be accessible.

The flash memory 3 of the mobile telephone 51 is connected to the CPU 1 through the sequencer 2 and is controlled in response to a control signal S23 sent from the sequencer 2. Moreover, the flash memory 3 is connected to the buffer 4 (in detail, a user data buffer 4A which will be described later) and can transfer stored contents and a recognition number which will be described below together with the buffer 4. In this case, the stored contents and the like can be directly transferred between the flash memory 3 and the buffer 4, that is, without the sequencer 2. In the mobile telephone 51, the flash memory 3 stores (one or more) user data (or contents) UD such as a telephone book. The flash memory 3 is a memory capable of rewriting data. Therefore, the user data UD can be added and changed.

In particular, the flash memory 3 has a sector data structure. More specifically, the flash memory 3 includes a plurality of sectors and stores contents (the user data UD) in a sector unit. In the flash memory 3, the stored contents are read out in a sector unit. Moreover, a read command and a sector address are sequentially input (in time series) so that the stored contents in a sector are serially read out.

Figure 2:
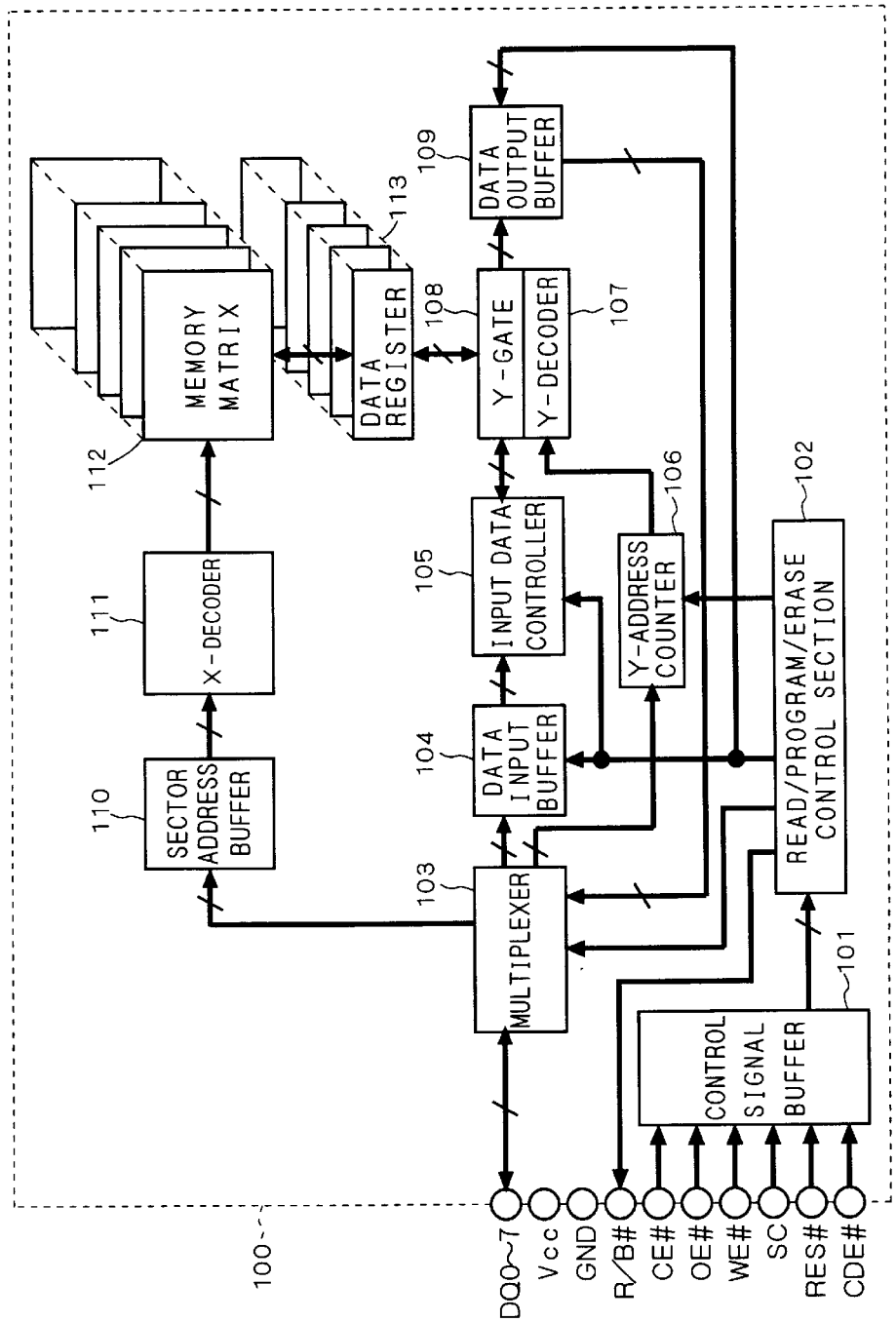
FIG. 2 is a typical block diagram showing a flash memory having a sector data structure.

FIG. 2 is a typical block diagram showing an AND type 256 Mbit flash memory 100 as an example of the flash memory 3 having a sector data structure, which will be described below.

A power potential and a ground potential are given to a power terminal Vcc and a ground terminal GND of the flash memory 100, respectively. Various control signals are input to a control signal buffer 101 of the flash memory 100 and are held temporarily therein. The control signal buffer 101 inputs a chip enable signal, an output enable signal, a write enable signal, a serial clock signal, a reset signal and a command enable signal through terminals CE#, OE#, WE#, SC, RES# and CDE#, respectively. The control signal to be given to the terminal taking a name having # attached to an end thereof is low active. These control signals are sent to a read/program/erase controller 102 provided in the flash memory 100. The flash memory 100 has a sector data structure and data are input to and output from terminals DQ0 to DQ7 in synchronization with the serial clock signal.

Furthermore, the flash memory 100 comprises a multiplexer 103, a data input buffer 104, an input data controller 105 and a data output buffer 109. The multiplexer 103 outputs data to the data input buffer 104 and receives data from the data output buffer 109. The input data controller 105 controls an input of data to a Y-gate 108 which will be described later. Moreover, the multiplexer 103 outputs information about an X-address and a Y-address to a sector address buffer 110 and a Y-address counter 106 which are provided in the flash memory 100, respectively.

All the multiplexer 103, the data input buffer 104, the input data controller 105, the Y-address counter 106 and the data output buffer 109 operate under control of the read/program/erase controller 102. Depending on an operating state of each section, moreover, the read/program/erase controller 102 outputs, to a terminal R/B #, a busy/ready signal indicating whether the flash memory 100 is set in a busy state or not.

Furthermore, the flash memory 100 comprises an X-decoder 111 and a Y-decoder 107 which receive an X-address and a Y-address from the sector address buffer 110 and the Y-address counter 106 and decode them, respectively.

The flash memory 100 further comprises a memory matrix 112 having a flash memory cell arranged and a data register 113 for storing data in a sector unit. For example, the same number of memory matrices 112 and data registers 113 are provided. Data are input and output to and from the memory matrix 112 through the data register 113 and the Y-gate 108.

In particular, different recognition numbers N are added to the user data UD in the mobile telephone 51. The flash memory 3 stores the user data UD and the recognition number N thereof in the same sector. At this time, it is also possible to grasp that the recognition number N is given to a sector in which the user data UD are stored.

Figures 3, 4:
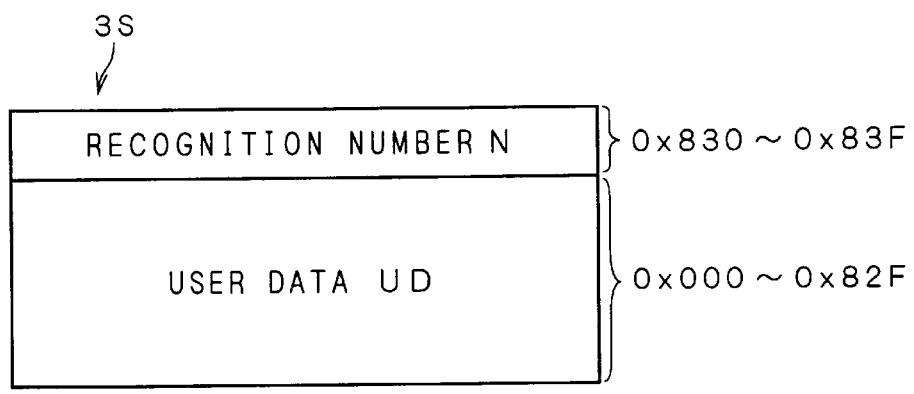
FIG. 3 is a typical diagram illustrating a data structure in a sector of the flash memory according to the first embodiment.
FIG. 4 is a diagram illustrating a correspondence of user data to a recognition number according to the first embodiment.

FIG. 3 is a typical diagram illustrating a data structure in one sector 3S of the flash memory 3 in the mobile telephone 51. As shown in FIG. 3, the user data UD are stored in addresses 0x000 to 0x82F of the sector 3S of the flash memory 3 and the recognition number N is stored in addresses 0x830 to 0x83F. "x" in an address notation indicates any hexadecimal number. A general redundant portion of the flash memory can be utilized as an area in which the recognition number is stored (corresponding to the addresses 0x830 to 0x83F), for example.

FIG. 4 shows an example of a correspondence of the user data UD to the recognition number N. As shown in FIG. 4, for example, "0x8EE3F138", "0x8EE3FD38" and "0x8EE3FE38" are given as the recognition numbers N of telephone book data I, music dada I and music data II, respectively. Such a correspondence is described in a firmware FW of the DINOR type flash memory 15, and the CPU 1 can know the correspondence of the user data UD to the recognition number N by utilizing the firmware FW.

The user data UD having a larger capacity than that of one sector are divided into a plurality of portions to be stored in a plurality of sectors. At this time, the data thus divided can be regarded as new user data UD, respectively, to which recognition numbers are given respectively.

The buffer 4 of the mobile telephone 51 is constituted by a general random accessible volatile memory, for example, a DRAM (dynamic random access memory) or a SRAM (static RAM) or the like. In particular, the buffer 4 includes the buffer memory (hereinafter referred to as a "user data buffer") 4A for storing user data. Herein, a predetermined area in the RAM or the semiconductor memory (a so-called work memory which is not shown) to give a work area for the CPU 1 is used as the buffer 4. Moreover, the user data buffer 4A has the same capacity as that of one sector of the flash memory 3, and stores the user data UD and the recognition number N thereof with the same data structure (see FIG. 3) as that of the sector 3S of the flash memory 3.

The user data buffer 4A is provided such that the CPU 1 is directly accessible. The CPU 1 can utilize the contents (that is, the user data UD) stored in the user data buffer 4A. As described above, moreover, the user data buffer 4A is connected to the flash memory 3 and can directly transfer the stored contents and the like together with the flash memory 3. Moreover, the buffer 4 (the user data buffer 4A) is controlled in response to a control signal S24A sent from the sequencer 2.

The sequencer 2 receives a control signal (or a control instruction) S1 from the CPU 1 and generates control signals S23 and S24A based on the control signal S1. The flash memory 3 and the buffer 4 are controlled with the control signals S23 and S24A, respectively.

In detail, the sequencer 2 includes a 16-bit (bit 0 to bit 15) operating state register (hereinafter referred to as a "register") 2A, for example, and the CPU 1 writes the control signal S1 to the register 2A. FIG. 5 is a typical diagram showing the register 2A. The CPU 1 writes, to bits 2 to 15 of the register 2A (hereinafter referred to as an "FMPSN"), a physical sector address of a sector of the flash memory 3 in which desired (predetermined) user data UD are stored. Furthermore, the CPU 1 writes (sets) "1" to a bit 0 of the register 2A. The bit 0 of the register 2A (which will be hereinafter referred to as "SeqFExe") gives a start instruction for a transfer processing to the sequencer 2. More specifically, the control signal S1 includes information about a physical sector address of a desired sector and the start instruction for the transfer processing. A bit 1 of the register 2A is an invalid bit.

The sequencer 2 generates and outputs the control signals S23 and S24A based on the control signal S1 written to the register 2A. The sequencer 2 controls the flash memory 3 and the buffer 4 with the control signals S23 and S24A, and transfers predetermined user data UD in the sector of the physical sector address written to the FMSPN to the user data buffer 4A and stores (copies) the same user data UD therein. At this time, the sequencer 2 transfers both the user data UD to be transferred and the recognition number N thereof (therefore, transfers all the contents in one sector) and stores (copies) them in the user data buffer 4A.

During the processing of transferring the user data UD and the recognition number N, a value of the SeqFExe of the register 2A is maintained to be "1". After the transfer processing (more specifically, transfer for one sector) is completed, the sequencer 2 clears (resets) the value to "0".

The main circuit section 31 includes other circuits, for example, a circuit having a telephone function and the like, which is not shown in FIG. 1. For example, the main circuit section 31 includes an antenna, a high-frequency circuit for transmitting and receiving a voice signal and various data signals through the antenna, a base band processing circuit connected to the high-frequency circuit and serving to carry out a processing such as modulation at a fundamental frequency, a signal processing section for carrying out a processing of coding/decoding a voice signal and a processing of expanding a received data signal and the like.

Figure 6:
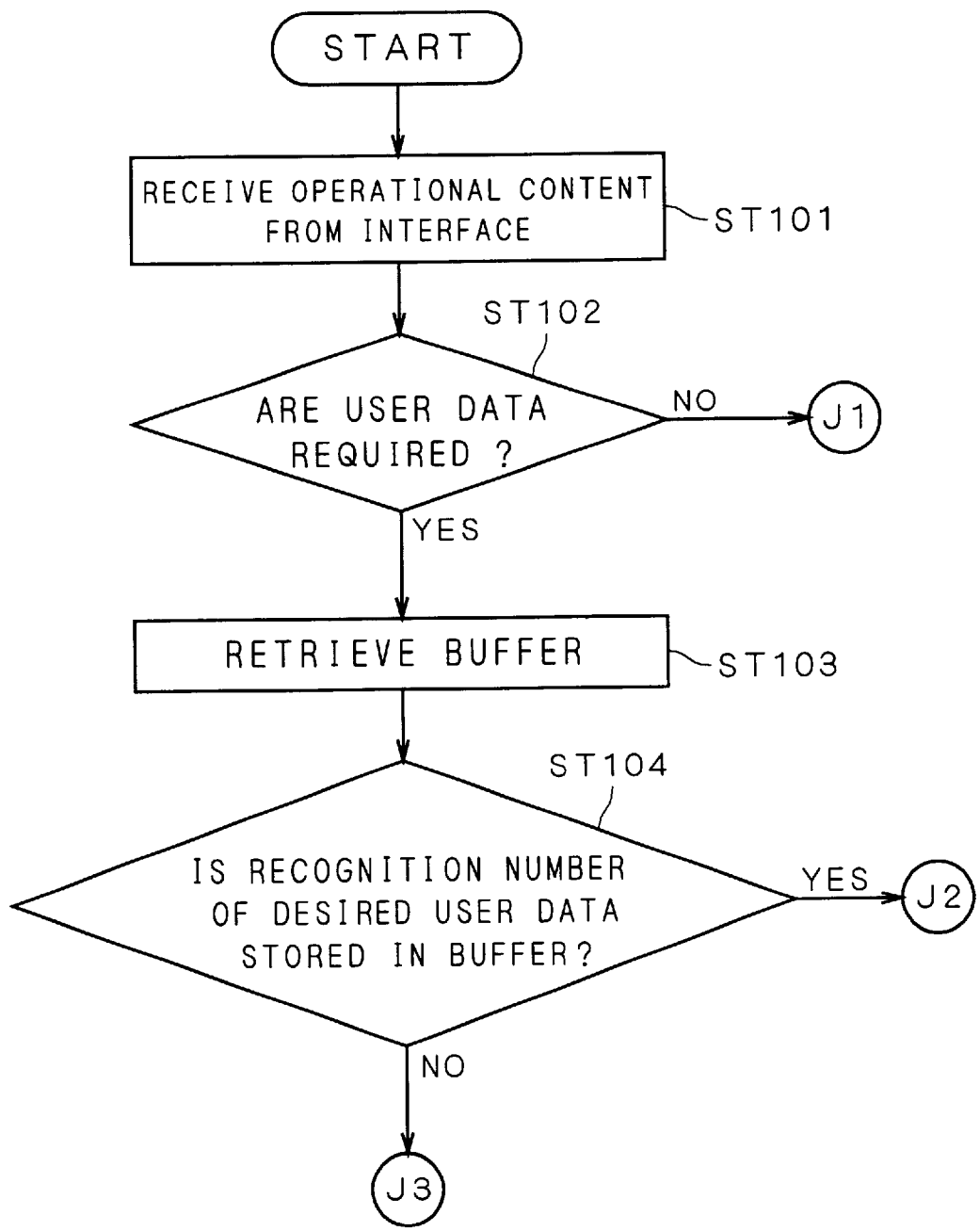
FIGS. 6 and 7 are flow charts for explaining an operation of the mobile telephone according to the first embodiment.
Figure 7:
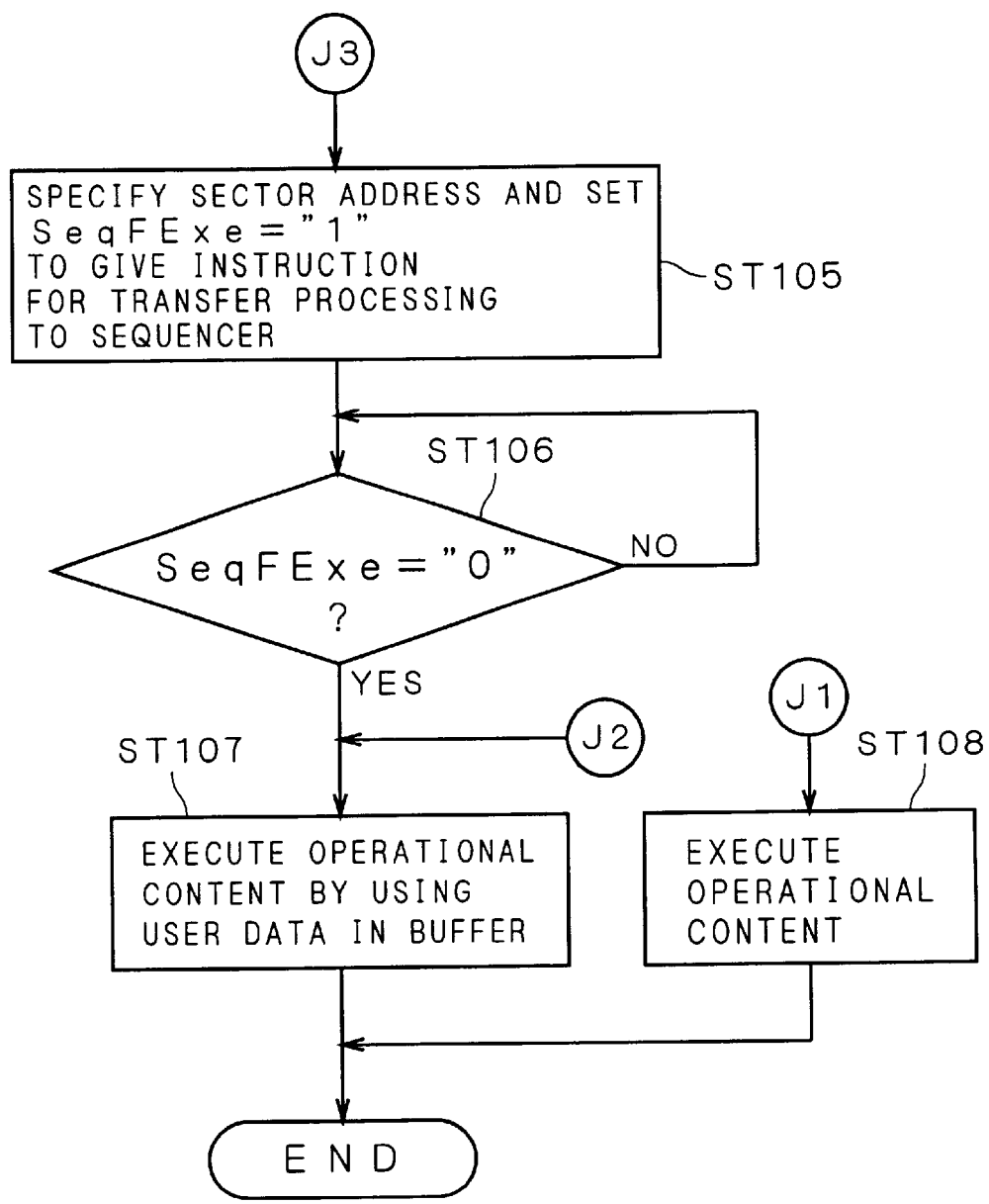

Next, a processing ST100 will be described as an example of a more specific operation or processing of the mobile telephone 51 (the element shown in FIG. 1) with reference to flow charts of FIGS. 6 and 7. FIGS. 6 and 7 are connected to each other through connectors J1, J2 and J3. The CPU 1 executes the processing ST100 in accordance with the firmware in the DINOR type flash memory 15. For convenience of description, it is assumed that user data UD and a recognition number N thereof have already been stored in the user data buffer 4A.

First, when the user operates the mobile telephone 51 through the input/output section 30, the CPU 1 receives the contents of the operation as a signal S20 through the interface 20 (Step ST101). Next, the CPU 1 decides whether the user data UD are required for the execution of the operational contents or not (Step ST102). When it is decided that the user data UD are not required at the Step ST102, the processing of the CPU 1 proceeds to Step ST108 where the operational contents are executed.

On the other hand, when it is decided that the user data UD are required at the Step ST102, the CPU 1 retrieves the user data buffer 4A (therefore, the buffer 4) (Step ST103), and it is decided whether desired (predetermined) user data UD are stored in the user data buffer 4A or not (Step ST104). In detail, the CPU 1 reads the recognition number N from the user data buffer 4A and it is decided whether or not the recognition number N thus read is coincident with a recognition number N of the desired user data UD at the Steps ST103 and ST104.

When it is decided that both recognition numbers N are coincident with each other and the desired user data UD are present in the user data buffer 4A at the Step S104, the processing of the CPU 1 proceeds to Step ST107. At the Step ST107, the CPU 1 executes the operational contents by using the user data UD in the user data buffer 4A.

On the other hand, when it is decided that both recognition numbers N are not coincident with each other and the desired user data UD are not present in the user data buffer 4A at the Step ST104, the CPU 1 executes the following Steps ST105 and ST106.

First, the CPU 1 generates a control signal S1 based on the operational contents and outputs the control signal S1 to the sequencer 2 at the Step ST105. More specifically, the CPU1 writes the physical sector address of the sector storing the desired user data UD to the FMPSN of the register 2A and "1" to the SeqFExe of the register 2A as described above. Consequently, the sequencer 2 starts to transfer the desired user data UD and the recognition number N thereof from the flash memory 3 to the user data buffer 4A. During the transfer processing, the CPU 1 continuously polls (monitors) a value of the SeqFExe and waits for the value of the SeqFExe to be set to "0" (Step ST106).

When the value of the SeqFExe is set to "0", the processing of the CPU 1 proceeds to the Step ST107 where the operational contents are executed by using the desired user data UD transferred to the user data buffer 4A.

The mobile telephone 51 can have the following effects.

First, the sequencer 2 transfers predetermined user data UD in the flash memory 3 to the buffer 4 (more specifically, the user data buffer 4A) and stores the same user data UD therein in response to the control instruction S1 of the CPU 1. Consequently, the CPU 1 accesses the buffer 4 in place of the flash memory 3 so that the predetermined user data UD can be utilized. Therefore, it is possible to absorb a difference in an access method between the flash memory 3 and the buffer 4 (or the user data buffer 4A), and the CPU 1 does not need to use or properly use the two kinds of access methods. As a result, it is possible to easily increase a memory capacity of the whole mobile telephone by mounting, on the mobile telephone 51, the flash memory 3 having a sector data structure suitable for an increase in the capacity.

Furthermore, the recognition number N is given to the user data UD, and the user data UD and the recognition number N thereof are stored in the buffer 4. Consequently, the user data UD stored in the buffer 4 can be specified based on the recognition number N. At this time, the CPU 1 retrieves the buffer 4 before giving the control instruction S1 to the sequencer 2, thereby deciding whether the predetermined (desired) user data UD are stored in the buffer 4 or not. As a result, it is possible to prevent an unnecessary or repetitive transfer processing for the user data UD.

In the case in which the predetermined user data UD are stored in the buffer 4, the CPU 1 can utilize the predetermined user data UD by accessing the buffer 4 without giving an instruction for the transfer processing to the sequencer 2. Accordingly, it is possible to implement a processing at a higher speed by omitting a time required for the transfer processing from the flash memory 3 to the buffer 4.

At this time, the detailed data constituting the user data UD are collectively specified in a sector unit based on the recognition number N. Consequently, the CPU 1 does not need to finely grasp the whole buffer 4 (that is, the detailed contents of the user data UD having the same capacity as that of the sector). At the Steps ST103 and ST104, similarly, it is not necessary to finely retrieve the whole buffer 4.

Moreover, the CPU 1 can know the end of the transfer processing by resetting the value of the register 2A of the sequencer 2 (the value of the SeqFExe). Consequently, the CPU 1 can properly know that the predetermined user data UD are available in the buffer 4.

<Second Embodiment>

Figure 8:
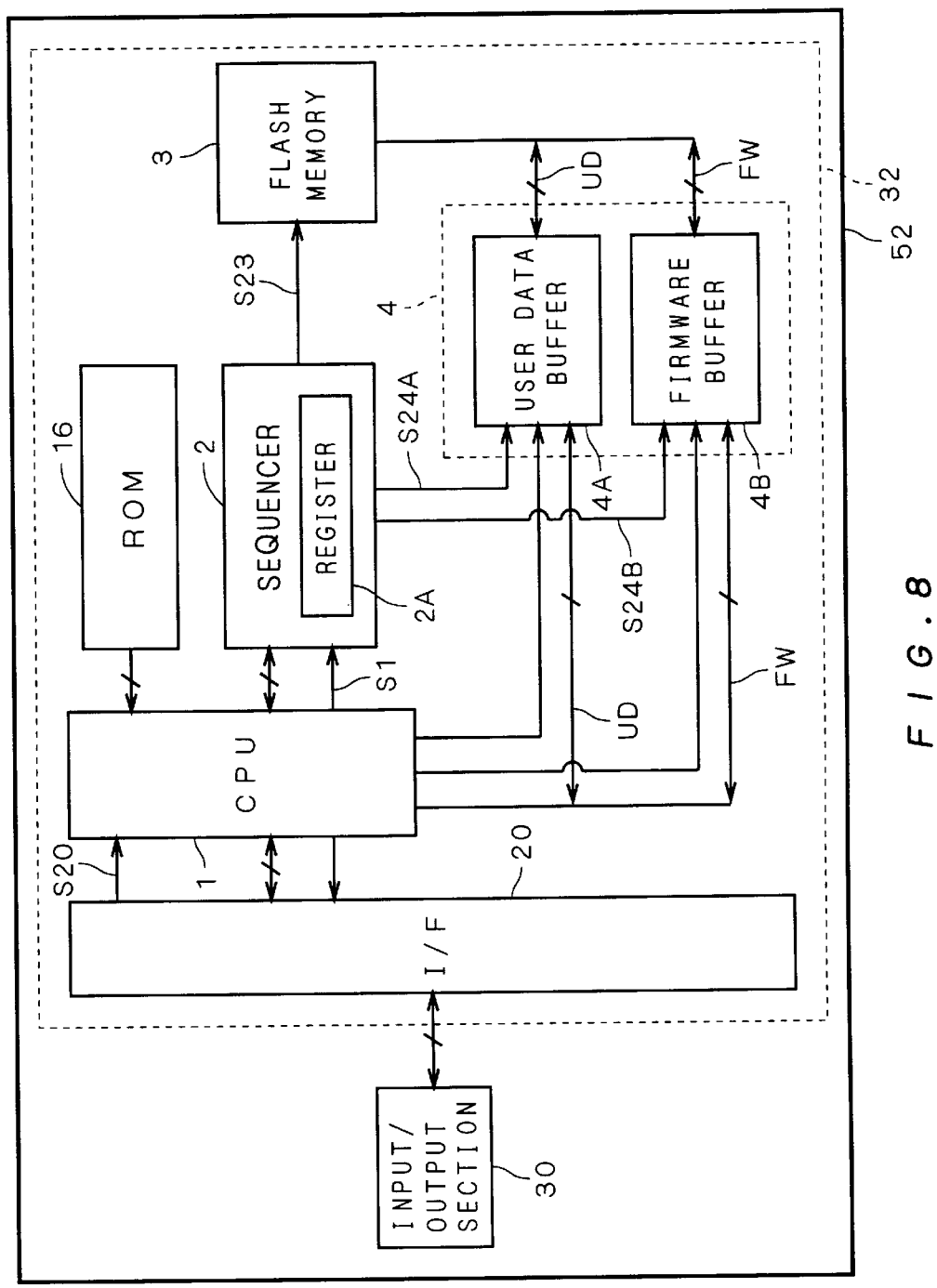
FIG. 8 is a typical block diagram showing a mobile telephone according to a second embodiment.

FIG. 8 is a typical block diagram showing a mobile telephone 52 according to a second embodiment. In the following description, the same components as described above have the same reference numerals and detailed explanation thereof will be cited.

As shown in FIG. 8, the mobile telephone 52 comprises an input/output section 30 and a main circuit section 32 which are connected to each other. The main circuit section 32 has basically the same structure as that of the main circuit section 31 described above (see FIG. 1). In the following, a difference between the main circuit section 32 and the main circuit section 31 will be described mainly.

First, the main circuit section 32 comprises a nonvolatile ROM (read only memory) 16 having a small capacity in place of the DINOR type flash memory 15 (see FIG. 1). The ROM 16 stores a firmware to be used when a power of the mobile telephone 52 is turned on, and the like.

In the mobile telephone 52, furthermore, a flash memory 3 stores (one or more) user data UD and a firmware (or contents) FW in a sector unit. Since the flash memory 3 is rewritable, the firmware FW can be added and changed. In the mobile telephone 52, particularly, different recognition numbers N are given to the user data UD and the firmware FW, respectively. The flash memory 3 stores the user data UD and the firmware FW together with the recognition numbers N thereof in the same sector.

Figures 9, 10:
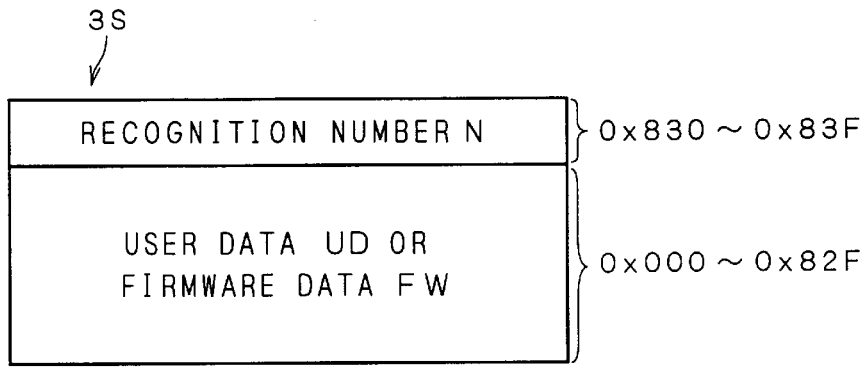
FIG. 9 is a typical diagram illustrating a data structure in a sector of a flash memory according to the second embodiment.
FIG. 10 is a diagram illustrating a correspondence of user data to a recognition number according to the second embodiment.

FIG. 9 is a typical diagram illustrating a data structure in one sector 3S of the flash memory 3 in the mobile telephone 52. As shown in FIG. 9, the user data UD or the firmwares FW are stored in addresses 0x000 to 0x82F of the sector 3S of the flash memory 3 in the mobile telephone 52. In the same manner as in the first embodiment (see FIG. 3), the recognition number N of the stored user data UD or firmware FW is stored in addresses 0x830 to 0x83F of the sector 3S.

Moreover, FIG. 10 shows an example of a correspondence of the user data UD and firmware FW to the recognition number N. As shown in FIG. 10, for example, "0x8EE3F138", "0x8EE3F238" and "0x8EE3F338" are given as the recognition numbers N of a firmware FW related to a user operation of "telephone book retrieval", a firmware FW related to a user operation of "home page retrieval" and a basic firmware FW used immediately after the power is turned on. Moreover, "0x8EE3F438" and "0x8EE3FE38" are given as the recognition numbers N of telephone book data I and music data II. In the same manner as in the first embodiment, such a correspondence is described in the firmware FW in the ROM 16.

The firmware FW having a larger capacity than that of one sector is regarded as a group of a plurality of firmwares FW. More specifically, the large firmware FW can be divided into a plurality of firmwares FW having capacities equal to or smaller than the capacity of one sector, respectively. In this case, recognition numbers are given to the respective firmwares FW thus obtained by the division.

In particular, a buffer (or a first semiconductor memory) 4 of the mobile telephone 52 includes a buffer 4B for storing a firmware (which will be hereinafter referred to as a "firmware buffer") in addition to the user data buffer 4A described above. The firmware buffer 4B includes a general random accessible volatile memory, for example, a DRAM, a SRAM or the like in the same manner as the user data buffer 4A. In the same manner as in the first embodiment, a predetermined area in a so-called work memory is used as the buffer 4, that is, the user data buffer 4A and the firmware buffer 4B. The firmware buffer 4B has the same capacity as that of one sector of the flash memory 3, and the firmware FW and the recognition number N thereof are stored with the same data structure (see FIG. 9) as that of the sector 3S of the flash memory 3.

The firmware buffer 4B is provided in the same manner as the user data buffer 4A. More specifically, the firmware buffer 4B is provided such that a CPU 1 is accessible, and the CPU 1 can utilize contents stored in the firmware buffer 4B (that is, the firmware FW). Moreover, the firmware buffer 4B is connected to the flash memory 3 and can directly transfer the firmware FW and the recognition number N together with the flash memory 3.

The buffer 4 includes the firmware buffer 4B. Therefore, a sequencer 2 of the mobile telephone 52 also controls the firmware buffer 4B in addition to the operation in the first embodiment described above. More specifically, the sequencer 2 generates a control signal S24B, corresponding to the control signal S24A, based on a control signal S1 sent from the CPU 1, and controls the firmware buffer 4B with the control signal S24B.

Moreover, the sequencer 2 of the mobile telephone 52 includes an operating state register 2B having a structure shown in FIG. 11. The register 2B has FMPSN and SeqFExe in the same manner as the register 2A described above (see FIG. 5), and a bit 1 is used as a bit for specifying a buffer (which will be hereinafter referred to as "BfNum") in the register 2B. A value of the BfNum is controlled by the CPU 1 and the sequencer 2 operates in accordance with the value of the BfNum.

More specifically, the CPU 1 writes (sets) "0" to the BfNum so that the sequencer 2 transfers the user data UD in the flash memory 3 to the user data buffer 4A. On the other hand, the CPU 1 writes "1" to the BfNum so that the sequencer 2 transfers the firmware FW in the flash memory 3 to the firmware buffer 4B. At this time, the sequencer 2 transfers the user data UD or firmware FW to be transferred and the recognition number N thereof to the user data buffer 4A or the firmware buffer 4B and stores them therein.

Other structures of the main circuit section 32 are similar to those of the main circuit section 31 described above (see FIG. 1).

Figure 12:
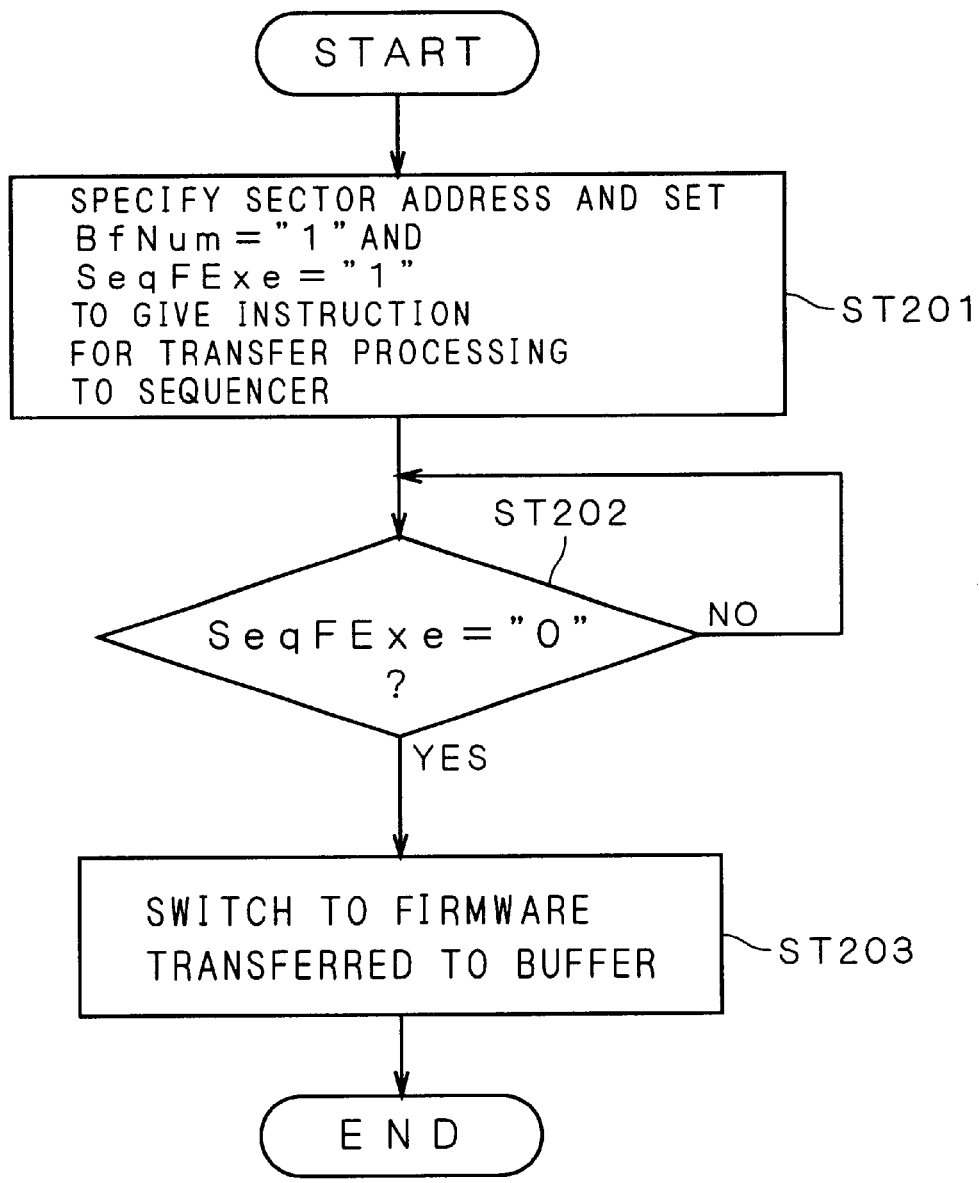
FIG. 12 is a flow chart for explaining an example of an operation of the mobile telephone according to the second embodiment.

Next, a processing ST200 will be described as an example of a more specific operation or processing of the mobile telephone 52 (the element shown in FIG. 8) with reference to a flow chart of FIG. 12. The processing ST200 is to be executed after a power of the mobile telephone 52 is turned on and before a user can actually operate the mobile telephone 52. The CPU 1 executes the processing ST200 in accordance with a firmware in the ROM 16. Immediately after the power is turned on, the volatile user data buffer 4A and firmware buffer 4B are empty, and an interface 20 is set in an unavailable state on a hardware basis.

When the power of the mobile telephone 52 is turned on, the CPU 1 generates the control signal S1 to be output to the sequencer 2. More specifically, the CPU 1 writes, to the FMPSN of the register 2B, a physical sector address of a sector storing a basic firmware FW used after the power is turned on, writes (sets) "1" to the BfNum of the register 2B and writes "1" to the SeqFExe, thereby operating the sequencer 2 (Step ST201). Consequently, the sequencer 2 starts to transfer the firmware FW and the recognition number N thereof from the flash memory 3 to the firmware buffer 4B.

During the transfer processing, the CPU 1 continuously polls the value of the SeqFExe and waits for the value of the SeqFExe to be set to "0" (Step ST202). When SeqFExe="0" is set, the processing procedure of the CPU 1 is switched from the firmware FW in the ROM 16 to the firmware FW transferred into the firmware buffer 4B (Step ST203).

Then, the CPU 1 releases the interface 20 in accordance with the firmware FW in the ROM 16 or the firmware buffer 4B.

Figure 13:
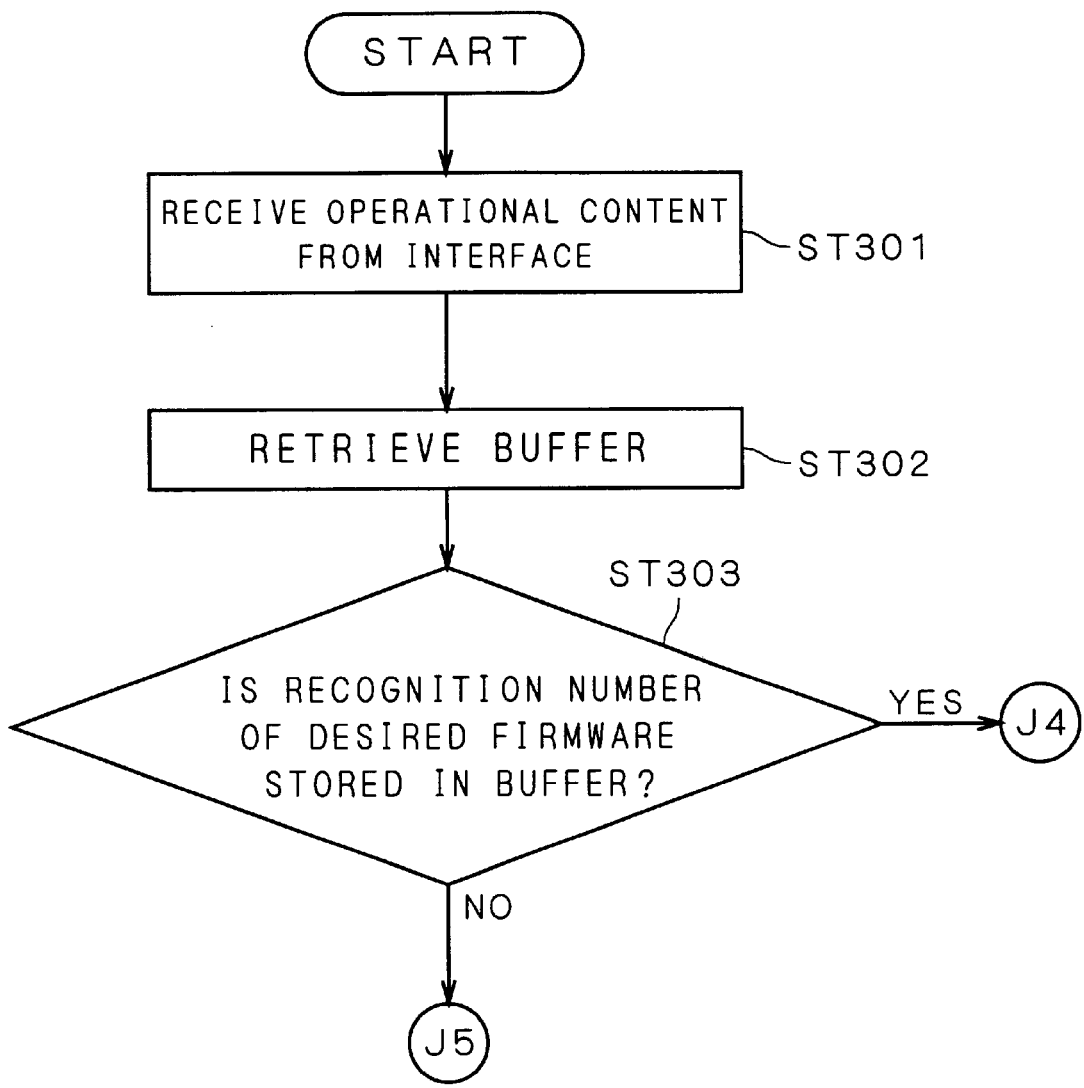
FIGS. 13 to 15 are flow charts for explaining other examples of the operation of the mobile telephone according to the second embodiment.
Figure 14:
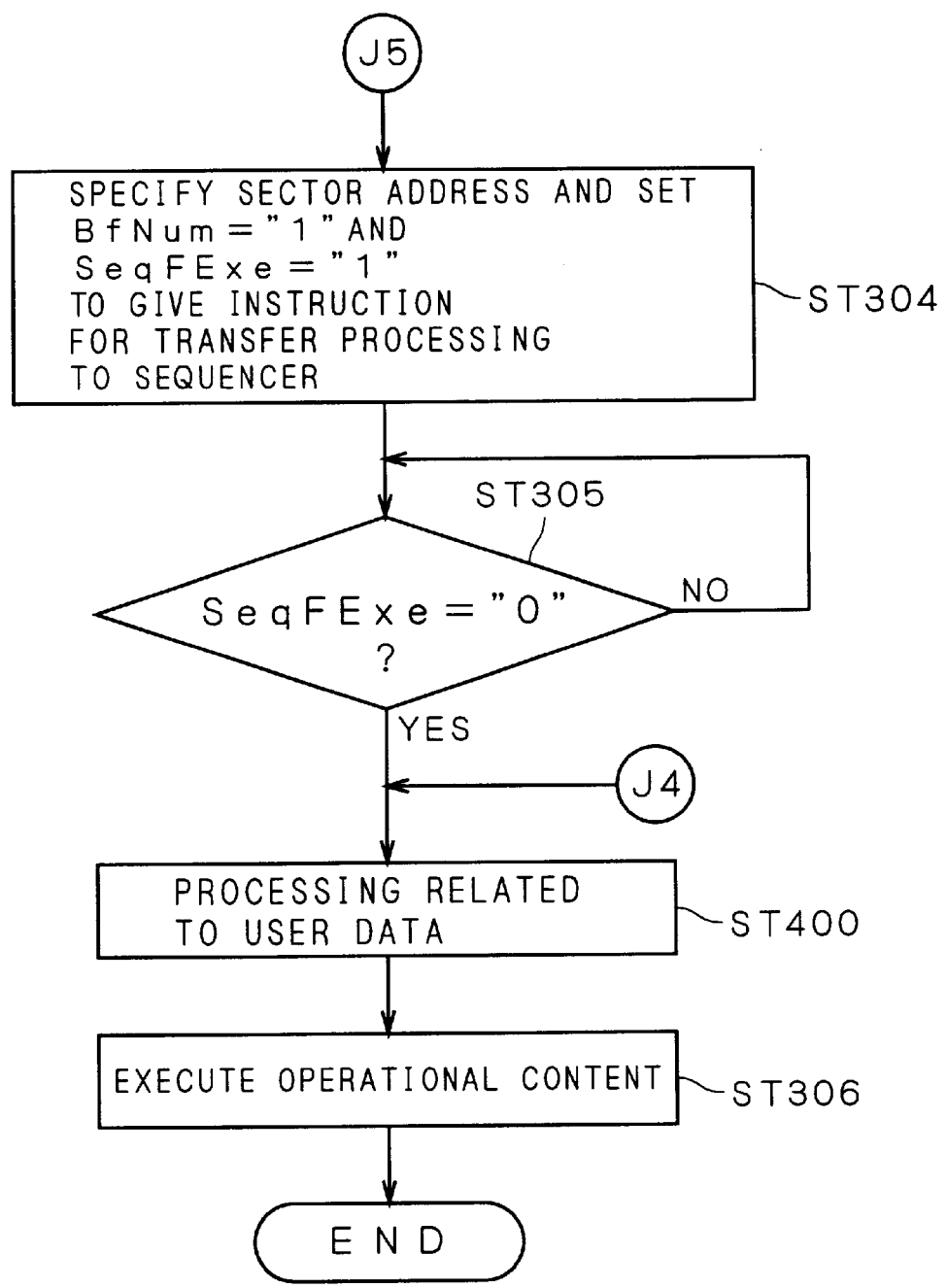

Next, a processing ST300 will be described as another example of a more specific operation or processing of the mobile telephone 52 with reference to flow charts of FIGS. 13 and 14. The processing ST300 is to be executed in the case in which the user operates the mobile telephone 52. FIGS. 13 and 14 are connected through connectors J4 and J5. In the same manner as in the first embodiment, it is assumed that user data UD and a recognition number N thereof have already been stored in the user data buffer 4A. Similarly, it is assumed that a firmware FW and a recognition number N thereof have already been stored in the firmware buffer 4B.

In the same manner as the Step ST101 (see FIG. 6), first, the CPU 1 receives operational contents as a signal S20 through the interface 20 (Step ST301). Next, the CPU 1 retrieves the firmware buffer 4B (therefore, the buffer 4) (Step ST302) and it is decided whether or not a predetermined firmware FW required for the execution of the operational contents is stored in the firmware buffer 4B (Step ST303). At the Steps ST302 and ST303, in detail, the CPU 1 reads the recognition number N from the firmware buffer 4B and it is decided whether or not the recognition number N thus read is coincident with a recognition number N of a desired (predetermined) firmware FW.

When it is decided that both recognition numbers N are coincident with each other and the desired firmware FW is present in the firmware buffer 4B at the Step ST303, the processing of the CPU 1 proceeds to Step ST400 which will be described below.

On the other hand, when it is decided that both recognition numbers N are not coincident with each other and the desired firmware FW is not present in the firmware buffer 4B at the Step ST303, the CPU 1 executes the following Steps ST304 and ST305.

First, the CPU 1 generates a control signal S1 based on the operational contents and outputs the control signal S1 to the sequencer 2 at the Step ST304. More specifically, the physical sector address of the sector storing the desired firmware FW is written to the FMPSN of the register 2B, "1" is written to the BfNum and "1" is written to the SeqFExe. Consequently, the sequencer 2 starts to transfer the desired firmware FW and the recognition number N thereof from the flash memory 3 to the firmware buffer 4B. During the transfer processing, the CPU 1 continuously polls a value of the SeqFExe and waits for the value of the SeqFExe to be set to "0" (Step ST305).

When the value of the SeqFExe is set to "0", the CPU 1 executes the processing ST400 related to the user data UD.

Figure 15:
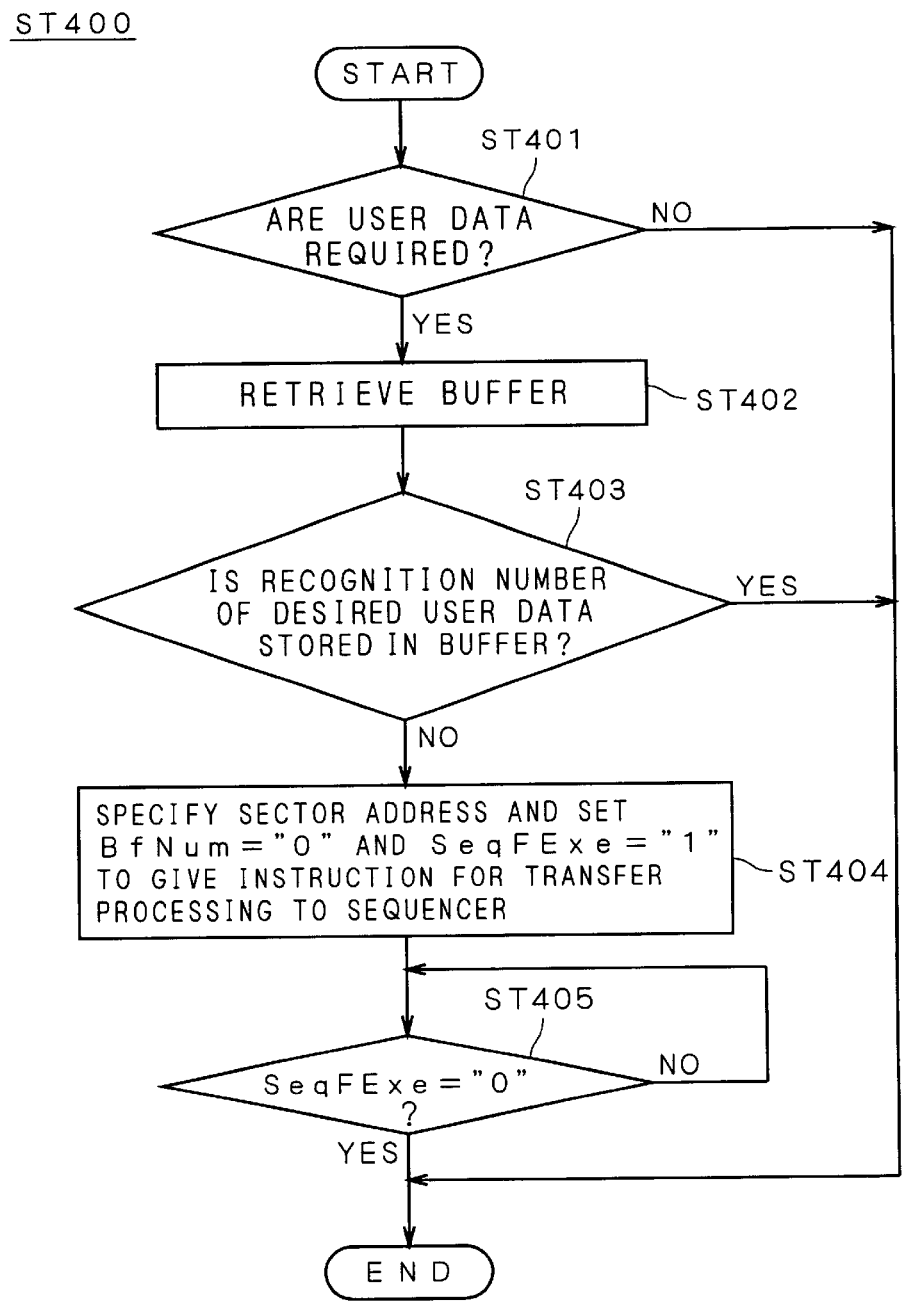

The processing ST400 will be described below with reference to a flow chart of FIG. 15.

At the processing ST400, first, the same Steps ST401 to ST403 as the Steps ST102 to ST104 described above (see FIG. 6) are executed. More specifically, at the Step ST401, the CPU 1 decides whether the user data UD are required for the execution of the operational contents or not. When it is decided that the user data UD are required at the Step ST401, the CPU 1 retrieves the user data buffer 4A (therefore, the buffer 4) (Step ST402), and decides whether the desired user data UD are stored in the user data buffer 4A or not (Step ST403).

When it is decided that the desired user data UD are present in the user data buffer 4A at the Step ST403 and it is decided that the user data UD are not required at the Step ST401, the CPU 1 ends the processing ST400 related to the user data UD and proceeds the processing to Step ST306 which will be described below (see FIG. 14).

On the other hand, when it is decided that the desired user data UD are not present in the user data buffer 4 at the Step ST403, the CPU 1 executes the same Steps ST404 and ST405 as the Steps ST105 and ST106 described above (see FIG. 7).

In this case, at the Step ST404, the CPU 1 generates the control signal S1 based on the operational contents and outputs the control signal S1 to the sequencer 2. More specifically, the physical sector address of the sector storing the desired user data UD is written to the FMPSN of the register 2B, "0" is written to the BfNum and "1" is written to the SeqFExe as described above. Consequently, the desired user data UD and the recognition number N thereof which are stored in the flash memory 3 are transferred to the user data buffer 4A.

After the CPU 1 confirms that the value of the SeqFExe is set to "0" at the Step ST405, the CPU1 ends the processing Step ST400 and executes Step ST306 which will be described later (see FIG. 14).

Returning to FIG. 14, when the processing Step ST400 is ended, the CPU 1 executes the operational contents of the user in accordance with the firmware FW in the firmware buffer 4B (Step ST306). In this case, the Step ST306 is equivalent to the Step ST107 or ST108 described above (see FIG. 7). More specifically, in the case in which the desired user data UD are required for the operational contents, the CPU 1 executes the operational contents by using the user data UD stored in the user data buffer 4A in the same manner as in the Step ST107 described above.

The mobile telephone 52 can have the following effects in addition to the effects of the mobile telephone 51 described above. More specifically, the buffer 4 includes the user data buffer 4A and the firmware buffer 4B. Differently from the case in which only one buffer equivalent to the buffers 4A and 4B is included, therefore, the user data UD and the firmware FW can be utilized at the same time or in parallel. Differently from the case in which the user data UD and the firmware FW are sequentially transferred to the corresponding buffer described above, consequently, the CPU 1 does not need to carry out an interruption processing for the transfer processing in the middle of the processing.

Such effects can be obtained by causing the buffer 4 to have a capacity for at least two sectors of the flash memory 3. In consideration of such a respect, when the user data buffer 4A and/or the firmware buffer 4B have/has a capacity for two or more sectors in the mobile telephone 52, the above-mentioned effects can be obtained more remarkably. In such a case, for example, the sequencer 2 manages an area in the buffer 4. Moreover, the same structure can also be applied to the user data buffer 4A of the mobile telephone 51 described above.

<First Variant>

In the first embodiment, there has been described the case in which both the user data UD and recognition number N stored in the flash memory 3 are transferred to the user data buffer 4A. As mentioned above, the correspondence of the user data UD to the recognition number N is described in the firmware FW in the DINOR type flash memory 15. Consequently, the following transfer processing can also be carried out.

More specifically, the sequencer 2 transfers only the user data UD from the flash memory 3 to the user data buffer 4A. In this case, the CPU 1 can write (or store) the recognition number N of the user data UD to be transferred to the user data buffer 4A in accordance with the firmware FW before or after the transfer of the user data UD.

As a matter of course, also in the case in which the firmware FW is to be transferred as in the second embodiment, the CPU 1 can write the recognition number N to the firmware buffer 4B.

<Second Variant>

Figure 16:
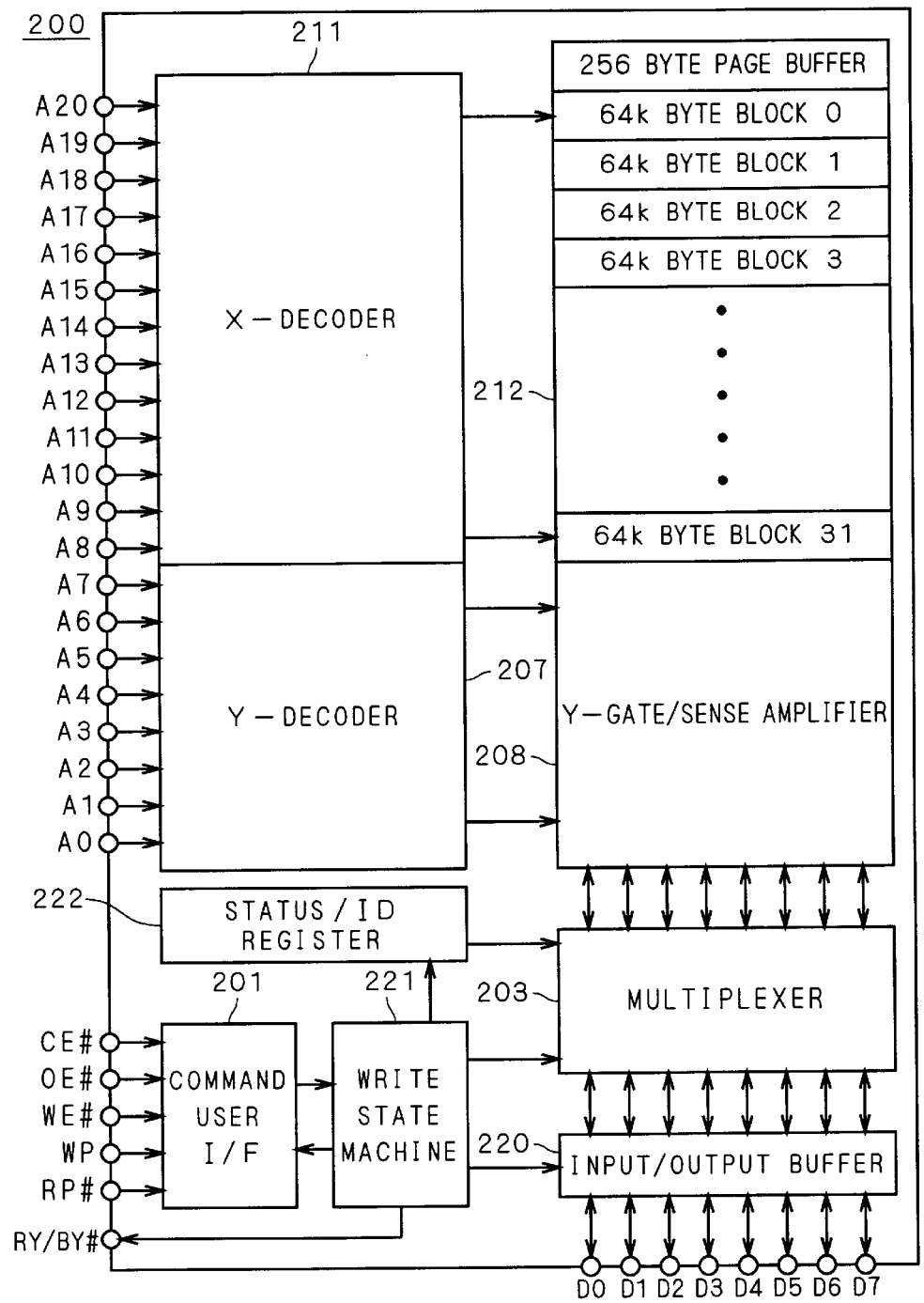
FIG. 16 is a typical block diagram showing a DINOR type flash memory as an example of a random accessible flash memory.

In the above description, the predetermined area in the RAM (the so-called work memory) for giving a work area for the CPU 1 is used as the buffer 4. Instead, the same RAM as the work memory may be provided separately for the buffer 4. Moreover, the RAMs may be provided for the user data buffer 4A and the firmware buffer 4B, respectively. In this case, it is also possible to apply a random accessible nonvolatile memory to the user data buffer 4A and/or the firmware buffer 4B, for example, the general DINOR type flash memory 200 shown in FIG. 16.

While the invention has been shown and described in detail, the foregoing description is in all aspects illustrative and not restrictive. It is therefore understood that numerous modifications and variations can be devised without departing from the scope of the invention.

What is claimed is:

1. A mobile telephone comprising:

a controller;

a first semiconductor memory which is random accessible and said controller can access;

a second semiconductor memory which is connected to said first semiconductor memory and includes a flash memory; and a memory-controller provided between said second semiconductor memory and said controller to connect said second semiconductor memory and said controller and to control said first semiconductor memory and said second semiconductor memory based on a control instruction sent from said controller, wherein said second semiconductor memory has a sector data structure including a plurality of sectors and storing a content in a sector unit, and said memory-controller controls said first semiconductor memory and said second semiconductor memory based on said control instruction sent from said controller, to execute a transfer processing of transferring a predetermined content stored in a predetermined one of said sectors to said first semiconductor memory and storing said predetermined content in said first semiconductor memory.

2. The mobile telephone according to claim 1, wherein said predetermined content has a predetermined recognition number, and said first semiconductor memory stores said predetermined content and said predetermined recognition number.

3. The mobile telephone according to claim 1, wherein said controller retrieves that said predetermined content is stored in said first semiconductor memory or not before giving said control instruction to said memory-controller.

4. The mobile telephone according to claim 2, wherein said controller retrieves that said predetermined recognition number is stored in said first semiconductor memory or not before giving said control instruction to said memory-controller.

5. The mobile telephone according to claim 1, wherein said first semiconductor memory has a capacity for at least two of said sectors.

6. The mobile telephone according to claim 1, wherein said memory-controller has a register for said controller to write said control instruction and resets a value of said register after said transfer processing is ended.

* * * * *

UNITED STATES PATENT AND TRADEMARK OFFICE
CERTIFICATE OF CORRECTION

PATENT NO.     : 6,771,979 B2
DATED          : August 3, 2004
INVENTOR(S)    : Fukuzumi It is certified that error appears in the above-identified patent and that said Letters Patent is hereby corrected as shown below:

<u>Title page, Item [54] and Column 1, lines 1-3,</u>
Title, should read -- MOBILE TELEPHONE WITH A TECHNIQUE FOR APPLYING A SEMICONDUCTOR MEMORY HAVING A SECTOR DATA STRUCTURE TO A MEMORY SYSTEM THEREOF --

Signed and Sealed this

Twenty-eighth Day of September, 2004

JON W. DUDAS
*Director of the United States Patent and Trademark Office*